(12) United States Patent  (10) Patent No.: US 8,975,802 B2
Matsuda et al.  (45) Date of Patent: Mar. 10, 2015

(54) ACOUSTIC WAVE DEVICE

(75) Inventors: Satoru Matsuda, Tokyo (JP); Takashi Matsuda, Tokyo (JP); Michio Miura, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 441 days.

(21) Appl. No.: 13/565,161

(22) Filed: Aug. 2, 2012

(65) Prior Publication Data

US 2013/0049533 A1     Feb. 28, 2013

(30) Foreign Application Priority Data

Aug. 31, 2011   (JP) .................................. 2011-189984

(51) Int. Cl.
*H03H 9/25* (2006.01)
*H03H 9/02* (2006.01)

(52) U.S. Cl.
CPC .................................. *H03H 9/02834* (2013.01)
USPC .................. 310/313 R; 310/313 D; 310/340; 310/346

(58) Field of Classification Search
CPC ....... G01N 29/022; G06G 7/195; H03H 3/04; H03H 3/08; F02N 61/167
USPC .......................... 310/313 R, 313 D, 340, 346
See application file for complete search history.

(56) References Cited

U.S. PATENT DOCUMENTS 8,664,835 B2 *   3/2014   Matsuda et al. .............. 310/341
2007/0018536 A1    1/2007   Kadota et al.

FOREIGN PATENT DOCUMENTS

WO    2005/093949 A1    10/2005

* cited by examiner

*Primary Examiner* — Thomas Dougherty
(74) *Attorney, Agent, or Firm* — Chen Yoshimura LLP

(57) ABSTRACT

An acoustic wave device includes: a comb-like electrode provided on a piezoelectric substrate; and a first medium that covers the comb-like electrode and has at least a silicon oxide film in which an element is doped, wherein sonic speed in the silicon oxide film in which the element is doped is lower than sonic speed in an undoped silicon oxide film.

13 Claims, 14 Drawing Sheets

ACOUSTIC WAVE DEVICE

CROSS-REFERENCE TO RELATED APPLICATION

This application is based upon and claims the benefit of priority of the prior Japanese Patent Application No. 2011-189984, filed on Aug. 31, 2011, the entire contents of which are incorporated herein by reference.

FIELD

A certain aspect of the present invention relates to an acoustic wave device.

BACKGROUND

There is known a surface acoustic wave (SAW) device as one of acoustic wave devices using an acoustic wave. The SAW device is small and light, and is capable of attenuating greatly. Therefore, the SAW device is used in various circuits processing a wireless signal in a frequency band of 45 MHz to 2 GHz in a wireless communication device such as a mobile phone unit or the like. The various circuits are a transmit band pass filter, a receive band pass filter, a local oscillation filter, an antenna duplexer, an IF filter, an FM modulator or the like.

Recently, improvement of frequency-temperature characteristic and downsizing of an acoustic wave device are needed, as performance of a mobile phone unit gets higher and the mobile phone unit is downsized. In order to improve the frequency-temperature characteristic, a silicon oxide film is provided so as to cover a comb-like electrode provided on a surface of a piezoelectric substrate. In order to reduce a device size, there is developed a boundary acoustic wave device in which a dielectric material of which sonic speed is higher than sonic speed in a silicon oxide film is provided on the silicon oxide film covering the comb-like electrode, and acoustic wave energy is confined between the dielectric material and a surface of a piezoelectric substrate.

Frequency variability caused by production tolerance is a common problem among the acoustic wave devices. The frequency is a resonance frequency and an anti-resonance frequency in a case of a resonator, and a center frequency of a pass band in a case of a filter. Various regulation methods are proposed with respect to the frequency variability. For example, International Publication No. 2005-093949 discloses a method for regulating a frequency by adjusting a thickness of a silicon oxide film covering a comb-like electrode and a method for forming a dielectric material on a silicon oxide film covering a comb-like electrode and regulating a frequency by adjusting a thickness of the dielectric material.

SUMMARY OF THE INVENTION

According to an aspect of the present invention, there is provided an acoustic wave device including: a comb-like electrode provided on a piezoelectric substrate; and a first medium that covers the comb-like electrode and has at least a silicon oxide film in which an element is doped, wherein sonic speed in the silicon oxide film in which the element is doped is lower than sonic speed in an undoped silicon oxide film.

DETAILED DESCRIPTION

With respect to an acoustic wave device in which a silicon oxide film covers a comb-like electrode formed on a surface of a piezoelectric substrate, a frequency is generally regulated by adjusting a thickness of the silicon oxide film. This is because sonic speed in the silicon oxide film is lower than sonic speed in the piezoelectric substrate, and the frequency can be regulated by adjusting amplitude of an acoustic wave distributed in the silicon oxide film. However, the sonic speed in the silicon oxide film is not sufficiently lower than sonic speed in the substrate. Therefore, the frequency changing amount with respect to the thickness changing amount of the silicon oxide film is not sufficiently large. Therefore, the frequency may be regulated by largely changing the thickness of the silicon oxide film. In this case, it may be difficult to adjust the thickness of the silicon oxide film to a desirable thickness through a single regulation process because of the production tolerance. And, the frequency regulation may be difficult.

First Embodiment

Figure 1A:
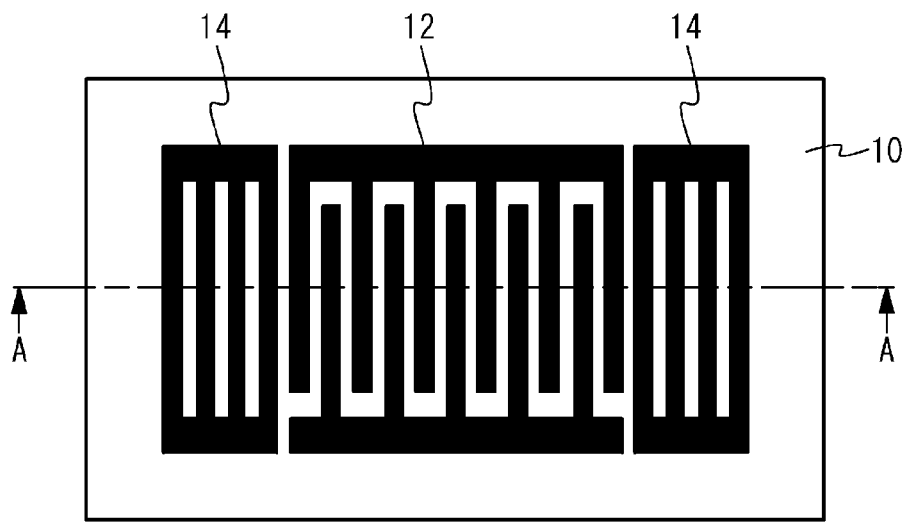
FIG. 1A illustrates a schematic top view of an acoustic device in accordance with a first embodiment.
Figure 1B:
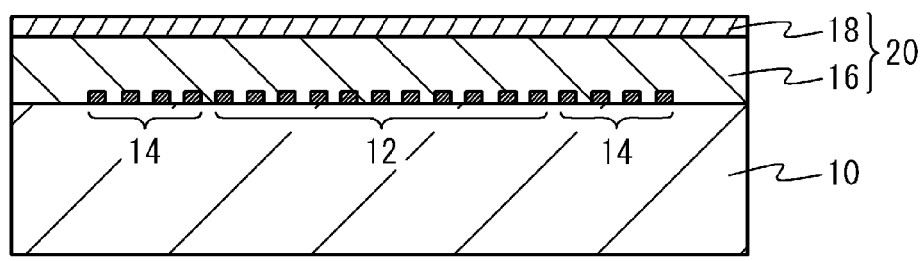
FIG. 1B illustrates a schematic cross sectional view taken along a line A-A of FIG. 1A.

FIG. 1A illustrates a schematic top view of an acoustic wave device in accordance with a first embodiment. FIG. 1B illustrates a schematic cross sectional view taken along a line A-A of FIG. 1A. In FIG. 1A, a first medium 20 is seen through. As illustrated in FIG. 1A, a reflection electrode 14 is provided at both sides of a comb-like electrode 12 in a propagation direction of an acoustic wave. The comb-like electrode 12 is an electrode exciting an acoustic wave. In the comb-like electrode 12, an electrode for inputting and another electrode for outputting are face each other, and an electrode finger of the electrode for inputting and an electrode finger of the electrode for outputting are arrayed alternately. The comb-like electrode 12 and the reflection electrode 14 are made of a material of which main component is copper (Cu). The electrode material may be aluminum (Al), titanium (Ti), gold (Au), nickel (Ni), chromium (Cr), tantalum (Ta), tungsten (W) or the like, other than Cu.

As illustrated in FIG. 1B, the comb-like electrode 12 and the reflection electrode 14 are provided on a piezoelectric substrate 10 made of lithium niobate (LN) or the like. The comb-like electrode 12 and the reflection electrode 14 are in contact with a surface of the piezoelectric substrate 10. An undoped silicon oxide (hereinafter referred to as $SiO_2$ film 16) is provided on the piezoelectric substrate 10 and covers the comb-like electrode 12 and the reflection electrode 14.

A silicon oxide film (hereinafter referred to as SiOF film 18) in which fluorine (F) is doped is provided on the $SiO_2$ film 16. For example, the SiOF film 18 is in contact with an upper face of the $SiO_2$ film 16. F amount of the SiOF film 18 is, for example, 8.8 atomic %. Thus, the first medium 20 including the $SiO_2$ film 16 and the SiOF film 18 is provided so as to cover the comb-like electrode 12 and the reflection electrode 14. As descried later, the SiOF film 18 is used for a frequency-regulating film for regulating a shift of frequency caused by production tolerance.

Figure 2A:
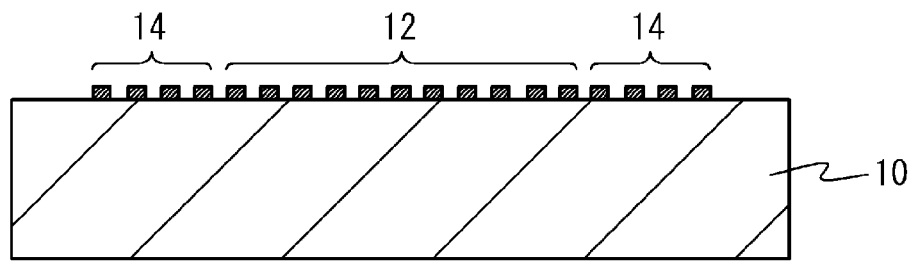
FIG. 2A through FIG. 2C illustrate a cross sectional view illustrating a method for manufacturing an acoustic wave device in accordance with the first embodiment.
Figure 2B:
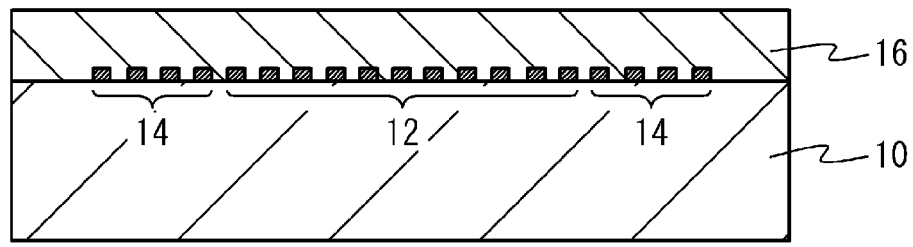
Figure 2C:
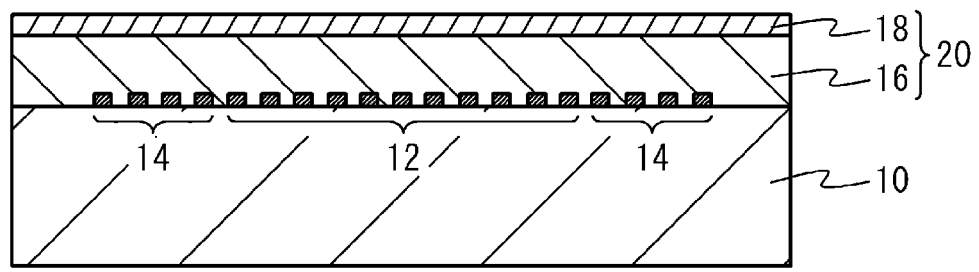

Next, a description will be given of a method for manufacturing the acoustic wave device in accordance with the first embodiment. FIG. 2A through FIG. 2C illustrate a schematic cross sectional view illustrating the method for manufacturing the acoustic wave device. The acoustic wave device is manufactured with use of a wafer piezoelectric substrate. Therefore, a plurality of regions to be acoustic wave devices are in a wafer plane. However, in FIG. 2A through FIG. 2C, one of the acoustic wave devices is illustrated. As illustrated in FIG. 2A, the comb-like electrode 12 and the reflection electrode 14 are formed on the piezoelectric substrate 10 by a sputtering method and an etching method. The comb-like electrode 12 and the reflection electrode 14 may be formed by a vapor deposition method and a lift-off method.

As illustrated in FIG. 2B, the $SiO_2$ film 16 covering the comb-like electrode 12 and the reflection electrode 14 is formed on the piezoelectric substrate 10 by a CVD (Chemical Vapor Deposition) method or the like. When the $SiO_2$ film 16 is formed, $SiH_4$ and $N_2O$ are used as a raw material gas, a flow ratio is $SiH_4:N_2O=1:50$, and a deposition temperature is 270 degrees C. The thickness of the $SiO_2$ film 16 is set to be smaller than a thickness making a frequency of the acoustic wave device correspond to a desirable frequency. In this case, it is preferable that the thickness of the $SiO_2$ film 16 is determined in view of thickness distribution of the $SiO_2$ film 16 in the wafer plane. The frequency may be a resonance frequency or an anti-resonance frequency in a case where the acoustic wave device is a resonator and may be a center frequency of a pass band in a case where the acoustic wave device is a filter. In the following description, a description will be given of a case where the frequency is the center frequency of the pass band.

As illustrated in FIG. 2C, the SiOF film 18 is formed on the $SiO_2$ film 16 by the CVD method or the like. Thus, the first medium 20 including the $SiO_2$ film 16 and the SiOF film 18 and covering the comb-like electrode 12 and the reflection electrode 14 is formed. Following the formation of the $SiO_2$ film 16, the formation of the SiOF film 18 is performed in single CVD equipment without breaking vacuum. Thus, intrusion of an impurity to an interface between the $SiO_2$ film 16 and the SiOF film 18 is restrained. When the SiOF film 18 is formed, $SiH_4$, $N_2O$ and $C_2F_6$ are used as a raw material gas, a flow ratio is $SiH_4:N_2O:C_2F_6=1:50:3$, and a deposition temperature is 270 degrees C. The thickness of the SiOF film 18 is set so that the center frequency of the pass band of the acoustic wave device corresponds to a desirable center frequency.

The thickness of the comb-like electrode 12, the thickness of the $SiO_2$ film 16, and the thickness of the SiOF film 18 may be shifted from a desirable thickness or may be distributed in the wafer plane, because of the production tolerance. Therefore, the center frequency of the pass band of the acoustic wave device may be shifted from the desirable center frequency. And so, the frequency is regulated by the following method.

A center frequency of a pass band is measured with respect to each of the acoustic wave devices formed on the wafer plane, after forming the SiOF film 18. And, the thickness of the SiOF film 18 is reduced so that the measured value of the center frequency corresponds to the desirable center frequency by an etching method or the like. Alternatively, the SiOF film 18 is further formed so that the thickness of the SiOF film 18 gets larger, by the CVD method or the like. As mentioned above, the thickness of the comb-like electrode 12, the thickness of the $SiO_2$ film 16 and the thickness of the SiOF film 18 may vary in the wafer plane. Therefore, etching amount or deposition amount of the SiOF film 18 during the frequency regulating may be different from each other among the acoustic wave devices in the wafer plane. In this case, the etching amount or the deposition amount of the SiOF film 18 may be adjusted with respect to the acoustic wave devices, if the SiOF film 18 is subjected to the etching or the deposition with use of a mask layer such as a resist. Thus, the frequency regulating can be achieved with respect to the acoustic wave devices in the wafer plane. In this way, the SiOF film 18 is used as the frequency-regulating film for regulating the frequency shift caused by the production tolerance.

Figure 3:
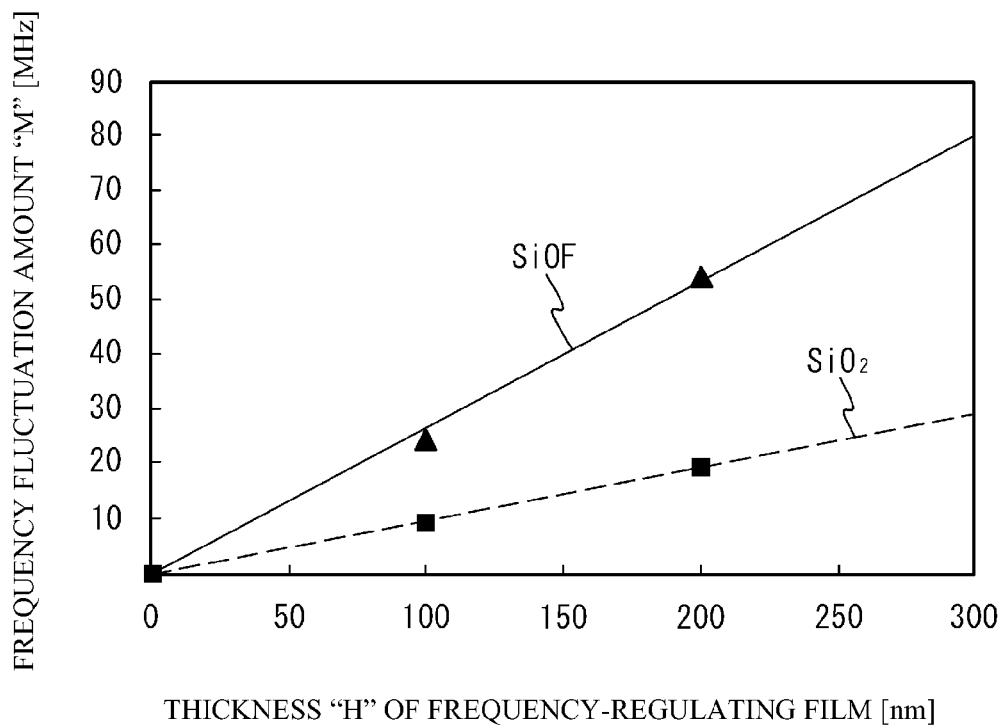
FIG. 3 illustrates a measurement result between a thickness and frequency fluctuation amount of a frequency-regulating film.

Here, a relationship between the thickness H and the frequency fluctuation amount M of the SiOF film 18 (F amount: 8.8 atomic %) was measured. For comparison, a relationship between the thickness H and the frequency fluctuation amount M of a $SiO_2$ film in a case where the $SiO_2$ film is used as the frequency-regulating film was measured. In the measurement, the $SiO_2$ film 16 covering the comb-like electrode 12 and the reflection electrode 14 was formed on the piezoelectric substrate 10 through the processes of FIG. 2A and FIG. 2B. And, the frequency-regulating film (the SiOF film or the $SiO_2$ film) was formed on the $SiO_2$ film 16. And, the center frequency of the pass band was measured with respect to the thickness of the frequency-regulating film of 0 nm, 100 nm, and 200 nm. The frequency-regulating film (the SiOF film or the $SiO_2$ film) was formed under the conditions described with reference to FIG. 2B and FIG. 2C. FIG. 3 illustrates the measurement result between the thickness H and the frequency fluctuation amount M of the frequency-regulating film. In FIG. 3, the frequency fluctuation amount M is illustrated using the center frequency of the pass band in the case where the thickness H of the frequency-regulating film is 0 nm as a reference. The measured values of the SiOF film are illustrated with a black triangle. And a fitted curve of the measured values of the SiOF film is illustrated with a solid line. The measured values of the $SiO_2$ film are illustrated with a black square. And a fitted curve of the measured values of the $SiO_2$ film is illustrated with a broken line.

As illustrated in FIG. 3, when the SiO$_2$ film is used as the frequency-regulating film, a relational formula M=0.096H is obtained between the thickness H and the frequency fluctuation amount M. On the other hand, when the SiOF film is used as the frequency-regulating film, a relational formula M=0.265H is obtained between the thickness H and the frequency fluctuation amount M. It is therefore found that, in the case where the SiOF film is used as the frequency-regulating film, the frequency fluctuation amount with respect to the thickness is larger than the case where the SiO$_2$ film is used as the frequency-regulating film. For example, it is found that the thickness of the SiOF film can be reduced to approximately 36% compared to the thickness of the SiO$_2$ film, with respect to a given frequency fluctuation amount. The reason that the frequency fluctuation amount with respect to the thickness of the SiOF film is large is that sonic speed in the SiOF film is lower than sonic speed in the SiO$_2$ film. Accordingly, it is found that the thickness fluctuation amount can be reduced in the case where the SiOF film is used as the frequency-regulating film compared to the case where the SiO$_2$ film is used as the frequency-regulating film, when the frequency-regulating amount is the same.

As mentioned above, in the acoustic wave device in accordance with the first embodiment, as illustrated in FIG. 1B, the first medium 20 is provided so as to cover the comb-like electrode 12 on the piezoelectric substrate 10. The first medium 20 has the SiO$_2$ film 16 (an undoped silicon oxide film) covering the comb-like electrode 12 and the SiOF film 18 (a silicon oxide film in which F is doped), of which sonic speed is lower than sonic speed in an undoped silicon oxide film, that is provided on the SiO$_2$ film 16. As described with reference to FIG. 2C, the SiOF film 18 (a silicon oxide film in which F is doped) is used as the frequency-regulating film. And, as described with reference to FIG. 3, the thickness fluctuation amount can be reduced during the frequency regulating when the SiOF film 18 is used as the frequency-regulating film, compared to the case where the SiO$_2$ film 16 is used as the frequency-regulating film. When the thickness fluctuation amount is reduced, the shift amount from the desirable thickness caused by the production tolerance can be reduced. It is therefore possible to adjust the thickness of the first medium 20 to a desirable thickness and adjust the frequency easily with a single thickness regulating with respect to the SiOF film 18.

As illustrated in FIG. 1B, the first medium 20 is structured with the SiO$_2$ film 16 and the SiOF film 18. As described with reference to FIG. 3, the frequency fluctuation amount with respect to the thickness of the SiOF film 18 is larger than that of the SiO$_2$ film 16. When the first medium 20 is structured with the SiO$_2$ film 16 and the SiOF film 18, the thickness of the first medium 20 can be reduced compared to the case where the first medium 20 is structured with only the SiO$_2$ film 16. Therefore, before the frequency regulating, the shift amount of the thickness of the first medium 20 from the desirable thickness or the distribution amount of the thickness of the first medium 20 in the wafer plane caused by the production tolerance can be suppressed. And, the thickness fluctuation amount in the frequency regulating can be reduced. Therefore, the frequency regulating can be easily performed. And, the processing time can be reduced because the thickness of the first medium 20 may be small.

A temperature coefficient of an elastic constant of the SiO$_2$ film 16 and the SiOF film 18 structuring the first medium 20 is positive. On the other hand, a temperature coefficient of an elastic constant of the piezoelectric substrate 10 is negative. That is, a sign of the temperature coefficient of the elastic constant of the SiO$_2$ film 16 (an undoped silicon oxide film) and the SiOF film 18 (a silicon oxide film in which F is doped) is opposite to a sign of the temperature coefficient of the elastic constant of the piezoelectric substrate 10. Therefore, the temperature coefficient of the elastic constant gets closer to zero, and the frequency-temperature characteristic may be improved, as a whole of the acoustic wave device.

For example, in Document 1, a dielectric material is formed on a silicon oxide film covering an comb-like electrode, the thickness of the dielectric material is adjusted, and thereby the frequency is regulated. The dielectric material is made of a material of which temperature coefficient of an elastic constant is negative or lower than that of a silicon oxide. However, in this case, the material having the negative or lower temperature coefficient is used in a region where the acoustic wave energy is distributed. It is difficult to take the temperature coefficient of the elastic constant closer to zero as the whole of the acoustic wave device. And, the frequency-temperature characteristic may be degraded. In order to take the temperature coefficient of the elastic constant closer to zero as the whole of the acoustic wave device, it is necessary to enlarge the thickness of the silicon oxide film. In this case, forming time of the silicon oxide film and the thickness distribution may be enlarged.

The first medium 20 is structured with the SiO$_2$ film 16 and the SiOF film 18. In the SiOF film 18, F is doped in SiO$_2$. Therefore, the film quality fluctuates according to the F concentration or the like. On the other hand, the SiO$_2$ film 16 is an undoped film. This results in small variability of film quality. Therefore, in order to improve the frequency-temperature characteristic and reduce the loss stably, a most part of the region in which the acoustic wave energy propagates is made of the SiO$_2$ film 16, and the rest is made of the SiOF film 18. That is, it is preferable that the SiO$_2$ film 16 is relatively thicker, and the SiOF film 18 is relatively thinner. The SiO$_2$ film 16 is provided in order to improve the frequency-temperature characteristic stably, and is not used for the frequency regulating. On the other hand, the SiOF film 18 is provided in order to achieve the frequency regulating easily.

Second Embodiment

Figure 4:
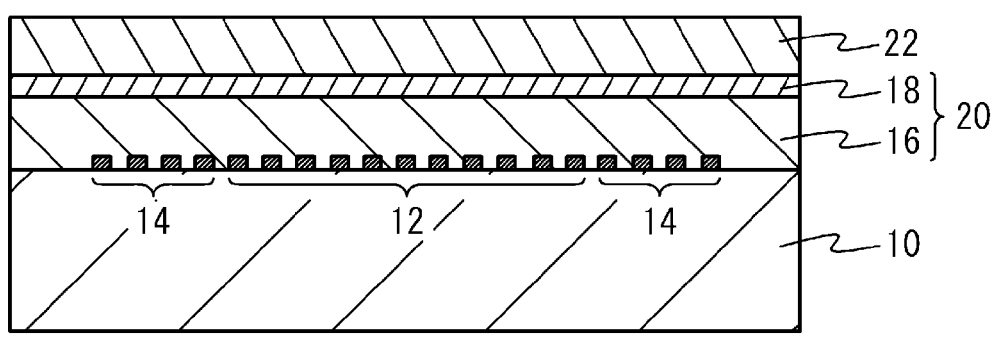
FIG. 4 illustrates a schematic cross sectional view of an acoustic wave device in accordance with a second embodiment.

FIG. 4 illustrates a schematic cross sectional view of an acoustic wave device in accordance with a second embodiment. As illustrated in FIG. 4, a second medium 22 made of an aluminum oxide film or the like is provided on the first medium 20. The other structures are the same as the first embodiment. Therefore, the explanation is omitted.

The sonic speed in the aluminum oxide film is higher than the sonic speed in the undoped silicon oxide film. As mentioned above, the sonic speed in the silicon oxide film in which F is doped is lower than the sonic speed in the undoped silicon oxide film. Therefore, the sonic speed in the second medium 22 on the first medium 20 is higher than the sonic speed in the first medium 20. Therefore, the acoustic wave energy is confined between the second medium 22 and the surface of the piezoelectric substrate 10. That is, the acoustic wave device in accordance with the second embodiment is a boundary acoustic wave device.

In the acoustic wave device in accordance with the second embodiment, the second medium 22 made of the aluminum oxide film of which sonic speed is higher than sonic speed in the first medium 20 is provided on the first medium 20 having the SiO$_2$ film 16 and the SiOF film 18. With respect to the acoustic wave device, the SiOF film 18 can be used as the frequency-regulating film, and the frequency can be regulated easily as well as the first embodiment. The thickness of the first medium 20 may be reduced. Thereby, the frequency regulating may be achieved easily.

The thickness of the second medium 22 may be off the desirable thickness because of the production tolerance of the second medium 22. However, the acoustic wave energy propagating in the second medium 22 is very small. Therefore, even if the thickness of the second medium 22 varies, the shift amount of the frequency caused by the thickness variability is very small and is ignorable.

Third Embodiment

Figure 5:
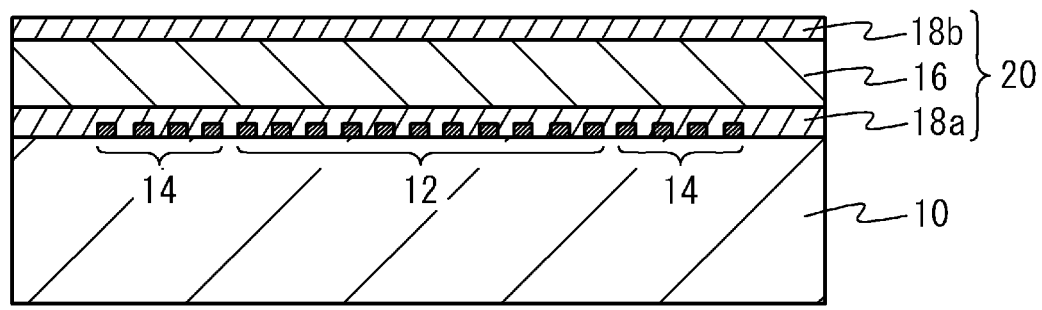
FIG. 5 illustrates a schematic cross sectional view of an acoustic wave device in accordance with a third embodiment.

FIG. 5 illustrates a schematic cross sectional view of an acoustic wave device in accordance with a third embodiment. As illustrated in FIG. 5, the acoustic wave device in accordance with the third embodiment is different from the acoustic wave in accordance with the first embodiment in a point that the first medium 20 covering the comb-like electrode 12 and the reflection electrode 14 has a three-layer structure of a SiOF film 18a, the SiO$_2$ film 16 and a SiOF film 18b. That is, the first medium 20 has the SiOF film 18a covering the comb-like electrode 12 and the reflection electrode 14, the SiO$_2$ film 16 provided on the SiOF film 18a, and the SiOF film 18b provided on the SiO$_2$ film 16. For example, the SiO$_2$ film 16 is in contact with an upper face of the SiOF film 18a. For example, the SiOF film 18b is in contact with the upper face of the SiO$_2$ film 16.

The acoustic wave device in accordance with the third embodiment is manufactured through the following manufacturing method. The SiOF film 18a covering the comb-like electrode 12 and the reflection electrode 14 is formed on the piezoelectric substrate 10 after the comb-like electrode 12 and the reflection electrode 14 are formed. After that, the frequency regulating is performed with use of the SiOF film 18a. The frequency regulating is performed in order to suppress the frequency variability among wafers. The reason that the frequency varies among the wafers is that the thickness of metal films varies among the wafers when the metal films acting as the comb-like electrode 12 and the reflection electrode 14 are formed on the wafers together with each other. In the frequency regulating, the thickness of the SiOF film 18a is reduced or enlarged so that the center frequency of the pass band is identical with respect to the acoustic wave devices of the wafers. It is therefore possible to reduce the frequency variability caused by the production tolerance of the comb-like electrode 12.

After the frequency regulating with use of the SiOF film 18a, the SiO$_2$ film 16 is formed on the SiOF film 18a. The SiOF film 18b is formed on the SiO$_2$ film 16. After that, the frequency regulating is performed with use of the SiOF film 18b. The frequency regulating is performed in order to suppress the frequency variability in the wafer plane. The reason that the frequency varies in the wafer plane is that there is variability among the thickness of the comb-like electrode 12, the thickness of the SiO$_2$ film 16, the thickness of the SiOF film 18a, the thickness of the SiOF film 18b. In the frequency regulating, the thickness of the SiOF film 18b is reduced or enlarged so that the center frequency of the pass band of the acoustic wave device corresponds to the desirable frequency.

In the acoustic wave device in accordance with the third embodiment, the first medium 20 has the SiOF film 18a (the silicon oxide film in which F is doped) covering the comb-like electrode 12, the SiO$_2$ film 16 (the undoped silicon oxide film) formed on the SiOF film 18a, and the SiOF film 18b (the silicon oxide film in which F is doped) formed on the SiO$_2$ film 16. In the acoustic wave device, the SiOF film 18a and the SiOF film 18b can be used as the frequency-regulating film, as well as the first embodiment. Thereby, the frequency regulating is achieved easily. And, the thickness of the first medium 20 can be reduced. Thereby, the frequency regulating can be achieved easily.

In accordance with the third embodiment, the first frequency regulating (for example, suppression of the frequency variability among the wafers) is performed with use of the SiOF film 18a, and the second frequency regulating (suppression of the frequency variability in the wafer plane) is performed with use of the SiOF film 18b. Thus, the frequency regulating is performed in two divided processes. This results in reduction of regulation width in each of the frequency regulating. And, each thickness changing amount of the SiOF films 18a and 18b can be reduced. Therefore, the frequency regulating can be performed more easily and more accurately.

Fourth Embodiment

Figure 6:
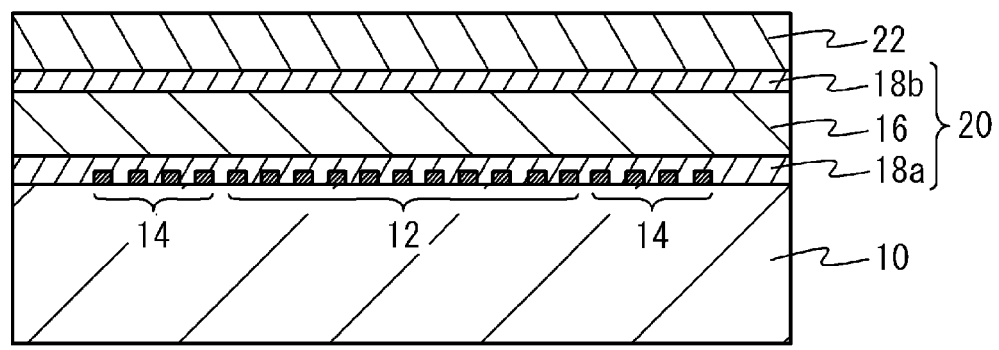
FIG. 6 illustrates a schematic cross sectional view of an acoustic wave device in accordance with a fourth embodiment.

FIG. 6 illustrates a schematic cross sectional view of an acoustic wave device in accordance with a fourth embodiment. As illustrated in FIG. 6, the second medium 22 made of an aluminum oxide film or the like is provided on the first medium 20. The other structure is the same as the third embodiment. Therefore, the explanation is omitted.

As illustrated in FIG. 6, the acoustic wave device in accordance with the fourth embodiment is a boundary acoustic wave device in which the second medium 22 of which sonic speed is higher than sonic speed in the first medium 20 is provided on the first medium 20. In the acoustic wave device, the SiOF films 18a and 18b can be used as the frequency-regulating film as well as the first embodiment. Thereby, the frequency regulating can be performed easily. And, the thickness of the first medium 20 can be reduced. Thereby, the frequency regulating can be performed easily. Further, the frequency regulating can be performed in two divided processes, with use of the SiOF films 18a and 18b. Therefore, the frequency regulating can be performed more easily and more accurately.

Fifth Embodiment

Figure 7:
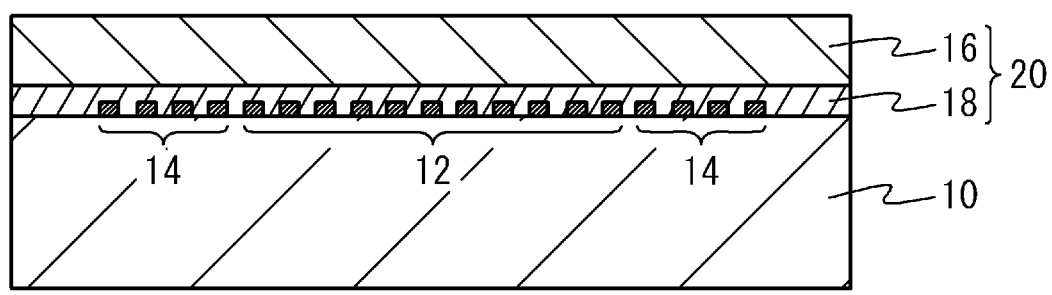
FIG. 7 illustrates a schematic cross sectional view of an acoustic wave device in accordance with a fifth embodiment.

FIG. 7 illustrates a schematic cross sectional view of an acoustic wave device in accordance with a fifth embodiment. As illustrated in FIG. 7, the acoustic wave device in accordance with the fifth embodiment is different from the acoustic wave device in accordance with the first embodiment in a point that the first medium 20 covering the comb-like electrode 12 and the reflection electrode 14 is structured with the SiOF film 18 covering the comb-like electrode 12 and the reflection electrode 14 and the SiO$_2$ film 16 provided on the SiOF film 18. For example, the SiO$_2$ film 16 is in contact with the upper face of the SiOF film 18.

The acoustic wave device in accordance with the fifth embodiment is manufactured through the following manufacturing method. The SiOF film 18 covering the comb-like electrode 12 and the reflection electrode 14 is formed after the comb-like electrode 12 and the reflection electrode 14 are formed on the piezoelectric substrate 10. After that, the frequency regulating is performed with use of the SiOF film 18. The frequency regulating is performed so that the variability of frequency among the wafers is suppressed, and the center frequency of the pass band of the acoustic wave devices of the wafers is equal to each other. In the frequency regulating, the thickness of the SiOF film 18 is reduced or enlarged.

After the frequency regulating with use of the SiOF film 18, the SiO$_2$ film 16 is formed on the SiOF film 18. After that, the frequency regulating is performed with use of the SiO$_2$ film 16. The frequency regulating is performed so that the frequency variability in the wafer plane is suppressed, and the center frequency of the pass band of the acoustic wave device corresponds to the desirable frequency. In the frequency regulating, the thickness of the $SiO_2$ film 16 is reduced or enlarged.

In the acoustic wave device in accordance with the fifth embodiment, the first medium 20 has the SiOF film 18 (the silicon oxide film in which F is doped) covering the comb-like electrode 12 and the $SiO_2$ film 16 (the undoped silicon oxide film) provided on the SiOF film 18. The frequency variability among the wafers can be suppressed when the SiOF film 18 is used as the frequency-regulating film. Therefore, the frequency regulating can be performed more easily than the acoustic wave device of which first medium 20 is structured with only the undoped silicon oxide film. And, the thickness of the first medium 20 can be reduced as well as the first embodiment. Thereby, the frequency regulating can be performed easily.

Sixth Embodiment

Figure 8:
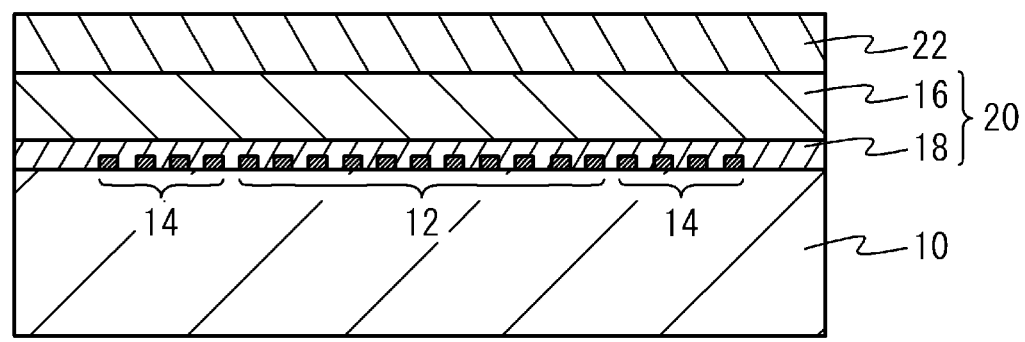
FIG. 8 illustrates a schematic cross sectional view of an acoustic wave device in accordance with a sixth embodiment.

FIG. 8 illustrates a schematic cross sectional view of an acoustic wave device in accordance with a sixth embodiment. As illustrated in FIG. 8, the second medium 22 made of the aluminum oxide film or the like is formed on the first medium 20. The other structure is the same as the fifth embodiment. Therefore, the explanation is omitted.

As illustrated in FIG. 8, the acoustic wave device in accordance with the sixth embodiment is a boundary acoustic wave device in which the second medium 22 of which sonic speed is higher than the first medium 20 is provided on the first medium 20. The frequency variability among the wafers can be regulated with use of the SiOF film 18 as the frequency-regulating film. Therefore, the frequency regulating can be performed easily as well as the fifth embodiment. And, the thickness of the first medium 20 can be reduced as well as the first embodiment. Thereby, the frequency regulating can be performed easily.

Seventh Embodiment

Figure 9:
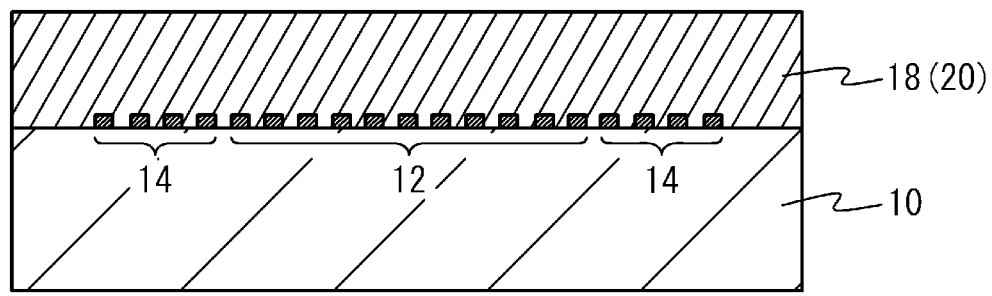
FIG. 9 illustrates a schematic cross sectional view of an acoustic wave device in accordance with a seventh embodiment.

FIG. 9 illustrates a schematic cross sectional view of an acoustic wave device in accordance with a seventh embodiment. As illustrated in FIG. 9, the acoustic wave device in accordance with the seventh embodiment is different from the acoustic wave device in accordance with the first embodiment in a point that the first medium 20 covering the comb-like electrode 12 and the reflection electrode 14 is structured with only the SiOF film 18 covering the comb-like electrode 12 and the reflection electrode 14.

Even if the first medium 20 is structured with only the SiOF film 18 (the silicon oxide film in which F is doped) covering the comb-like electrode 12, the SiOF film 18 can be used as the frequency-regulating film as well as the first embodiment, and the frequency regulating can be performed easily. And, the thickness of the first medium 20 can be reduced. Thereby, the frequency regulating can be performed easily.

Eighth Embodiment

Figure 10:
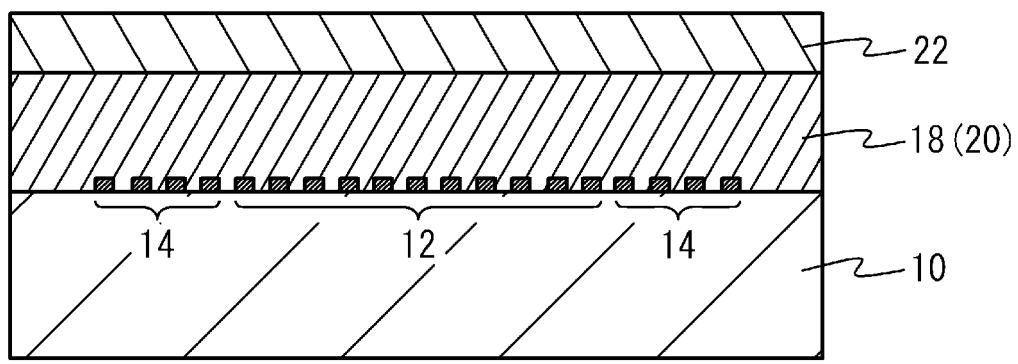
FIG. 10 illustrates a schematic cross sectional view of an acoustic wave device in accordance with an eighth embodiment.

FIG. 10 illustrates a schematic cross sectional view of an acoustic wave device in accordance with an eighth embodiment. As illustrated in FIG. 10, the second medium 22 made of the aluminum oxide film or the like is provided on the first medium 20. The other structure is the same as the seventh embodiment. Therefore, the explanation is omitted.

As illustrated in FIG. 10, the acoustic wave device in accordance with the eighth embodiment is a boundary acoustic wave device in which the second medium 22 of which sonic speed is higher than sonic speed in the first medium 20 is provided on the first medium 20. The SiOF film 18 can be used as the frequency-regulating film as well as the first embodiment, and the frequency regulating can be performed easily. And, the thickness of the first medium 20 can be reduced. Thereby, the frequency regulating can be performed easily.

As mentioned above, in the first embodiment through the eighth embodiment, the first medium 20 includes at least the SiOF film 18 of which sonic speed is lower than sonic speed in an undoped silicon oxide film, and the SiOF film 18 covers the comb-like electrode 12 on the piezoelectric substrate 10. With the structure, the frequency regulating can be performed easily.

In the first embodiment through the eighth embodiment, the SiOF film 18 (the silicon oxide film in which F is doped) is the silicon oxide film, in which an element is doped, included in the first medium 20. However, the structure is not limited. A silicon oxide film in which an element other than F is doped may be used as the SiOF film 18, if the sonic speed in the silicon oxide film is lower than sonic speed in the undoped silicon oxide film and the frequency changing amount of the silicon oxide film with respect to the thickness changing is larger than the undoped silicon oxide film. That is, the silicon oxide film, in which an element is doped, included in the first medium 20 has only to be a film of which sonic speed is lower than sonic speed in the undoped silicon oxide film. As the film of which sonic speed is lower than sonic speed in the undoped oxide film, a silicon oxide film in which chlorine (Cl), carbon (C), nitrogen (N), phosphorus (P) or sulfur (S) is doped may be used other than the silicon oxide film in which F is doped. Thus, it is preferable that an element to be replaced by "O" of the Si—O bond is doped in the silicon oxide film. And, the temperature coefficient of the elastic constant of the silicon oxide film in which the element is doped is positive, and has a sign opposite to the temperature coefficient of the elastic constant of the piezoelectric substrate 10. Therefore, enlargement of the thickness of the first medium 20 is restrained, the temperature coefficient of the elastic constant gets closer to zero as the whole of the acoustic wave device, and the frequency-temperature characteristic is improved.

As is the case of the first embodiment through the sixth embodiment, it is preferable that the first medium 20 includes an undoped silicon oxide film and a silicon oxide film in which an element is doped. This is because the variability of film quality of the undoped silicon oxide film is smaller than the silicon oxide film in which an element is doped, and the improvement of the frequency-temperature characteristic and the reduction of the loss are achieved stably. It is therefore preferable that the undoped silicon oxide film is relatively thicker, and the silicon oxide film in which an element is doped is relatively thinner.

Two or more different elements such as two different elements, three different elements, four different elements or the like may be doped in the silicon oxide film included in the first medium 20. In this case, the sonic speed in the silicon oxide film in which the elements are doped is lower than sonic speed in the undoped silicon oxide film, and the frequency changing amount with respect to the thickness changing of the silicon oxide film in which the element is doped is larger than the undoped silicon oxide film.

In the method for manufacturing the acoustic wave device, the comb-like electrode 12 is formed on the piezoelectric substrate 10. The first medium 20 including at least the silicon oxide film, of which sonic speed is lower than sonic speed in the undoped silicon oxide film, in which an element is doped, used as the frequency-regulating film is formed so as to cover the comb-like electrode 12. The frequency regulating is performed with use of the silicon oxide film in which an element is doped. Through the manufacturing method, the frequency regulating can be performed easily. The comb-like electrode 12 is formed on the piezoelectric substrate 10. The first medium 20 including the undoped silicon oxide film and the silicon oxide film, of which sonic speed is lower than sonic speed in the undoped silicon oxide film, in which an element is doped, used as the frequency-regulating film, is formed so as to cover the comb-like electrode 12. The frequency regulating is performed with use of the silicon oxide film in which an element is doped. With the manufacturing method, the frequency regulating can be performed easily, and the improvement of the frequency-temperature characteristic and reduction of loss can be achieved stably.

As mentioned above, in view of improving the frequency-temperature characteristic, it is preferable that the sign of the temperature coefficient of the elastic constant of the silicon oxide film, in which the element is doped, included in the first medium 20 is opposite to the sign of the temperature coefficient of the elastic constant of the piezoelectric substrate 10. In this case, it is preferable that the peak wavenumber (the number of peak waves) measured by an FTIR (Fourier Transform Infrared Spectroscopy) method of the silicon oxide film in which an element is doped is larger than that of the undoped silicon oxide film included in the first medium 20. And, it is preferable that a half-value width measured by the FTIR method of the silicon oxide film in which an element is doped is smaller than that of the undoped silicon oxide film included in the first medium 20. The reason is described in the following description.

Figure 11:
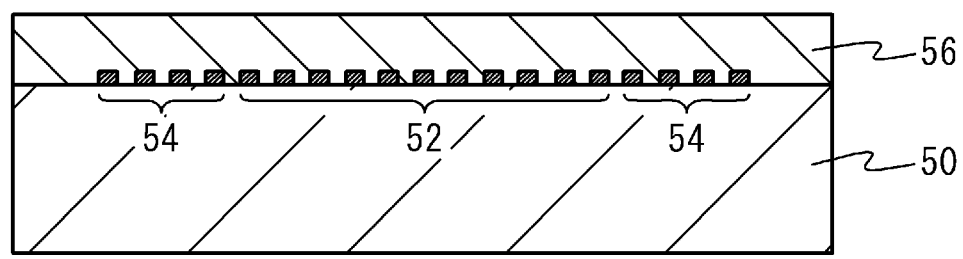
FIG. 11 illustrates a schematic cross sectional view of an acoustic wave device in accordance with a first comparative example.

FIG. 11 illustrates a schematic cross sectional view of a resonator in accordance with a first comparative example. As illustrated in FIG. 11, a comb-like electrode 52 and a reflection electrode 54 are provided on a piezoelectric substrate 50 made of an LN substrate or the like. The comb-like electrode 52 and the reflection electrode 54 are made of a material of which main component is Cu. An undoped silicon oxide film (hereinafter referred to as a $SiO_2$ film 56) is formed on the piezoelectric substrate 50 so as to cover the comb-like electrode 52 and the reflection electrode 54. The $SiO_2$ film 56 is formed by a CVD method or the like. The thickness of the $SiO_2$ film 56 is 0.3λ. The "λ" is a wavelength of an acoustic wave and corresponds to a pitch of each electrode finger of the comb-like electrode 52.

The $SiO_2$ film 56 was formed by the CVD method or the like on various forming conditions. The temperature, the pressure, the raw material gas, the flow rate of the raw material gas and the high frequency output power (high frequency electric power for generating plasma) were changed as the forming conditions. In this way, the temperature coefficient of anti-resonance frequency (TCF) was measured with respect to a plurality of resonators manufactured on various forming conditions. A $SiO_2$ film formed by the same forming condition as the $SiO_2$ film 56 was measured by the FTIR (Fourier Transform Infrared Spectroscopy) method. The FTIR method is a method in which infrared light is radiated to a substance, and the composition of the substance is analyzed based on absorption amount of the infrared light having energy corresponding to vibration energy of a molecule. An absorption wave of stretching vibration of a Si—O bond in $SiO_2$ was focused on.

Figure 12:
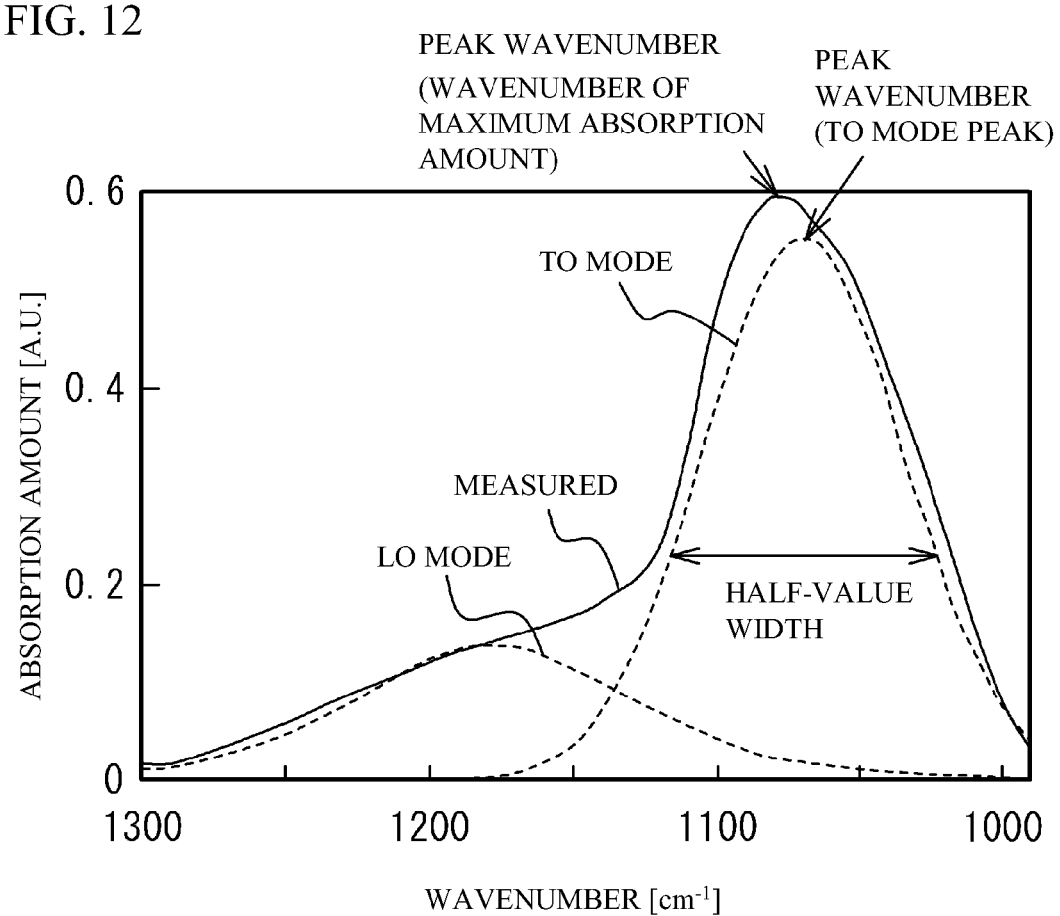
FIG. 12 illustrates a FTIR result of stretching vibration of Si—O bond.

FIG. 12 illustrates a FTIR result of the stretching vibration of the Si—O bond. The absorption amount of arbitrary coordinate is illustrated with respect to the wavenumber. The number of wave peaks at which absorption amount was maximum was measured, and the number of the peak waves at which the absorption amount was maximum was indicated by the number of peak waves (the number of waves of the maximum absorption). There are a transverse optical (TO) mode and a longitudinal optical (LO) mode in the absorption of the stretching vibration. In FIG. 12, the absorption of the stretching vibration was separated into the TO mode and the LO mode, and a half-value width of the TO mode was measured. And, the peak wavenumber of the TO mode is indicated by the peak wavenumber (the TO mode peak).

Figure 13:
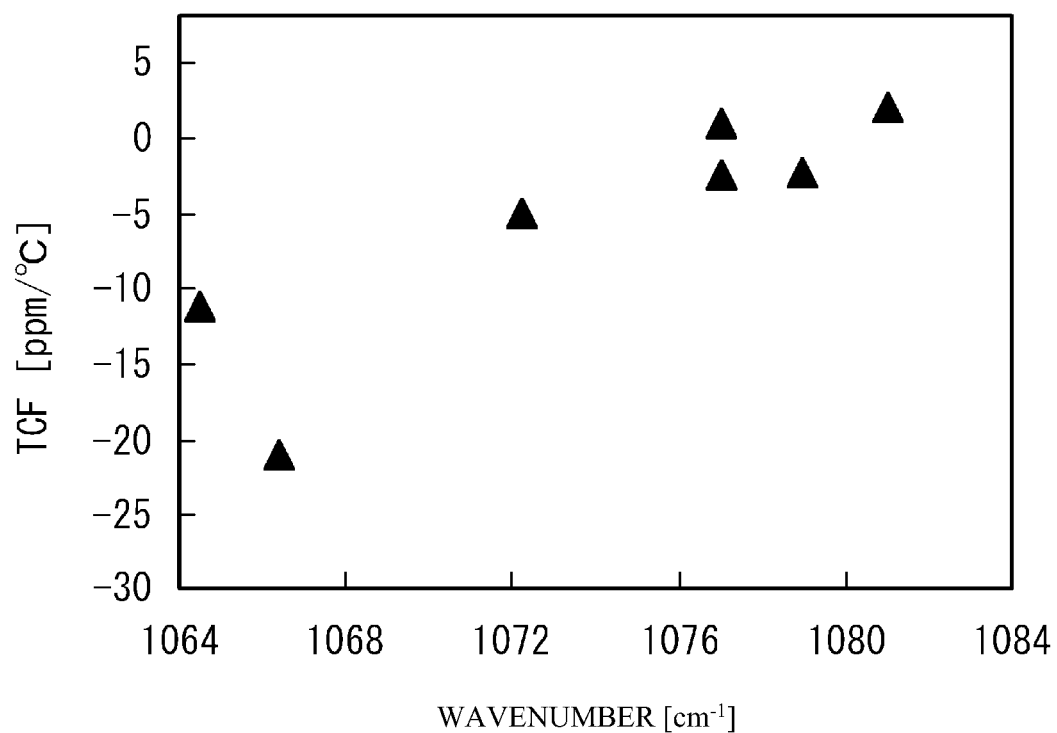
FIG. 13 illustrates TCF of an anti-resonance frequency of a resonator with respect to peak wavenumber measured by a FTIR method (the number of waves of maximum absorption)

FIG. 13 illustrates the TCF of the anti-resonance frequency of the resonator with respect to the peak wavenumber measured by the FTIR method (the number of waves of the maximum absorption). In FIG. 13, the measurement results of each forming condition are indicated by a black triangle. As illustrated in FIG. 13, when the peak wavenumber gets larger, the TCF of the anti-resonance frequency gets larger and gets closer to zero. Therefore, the TCF is improved.

Figure 14:
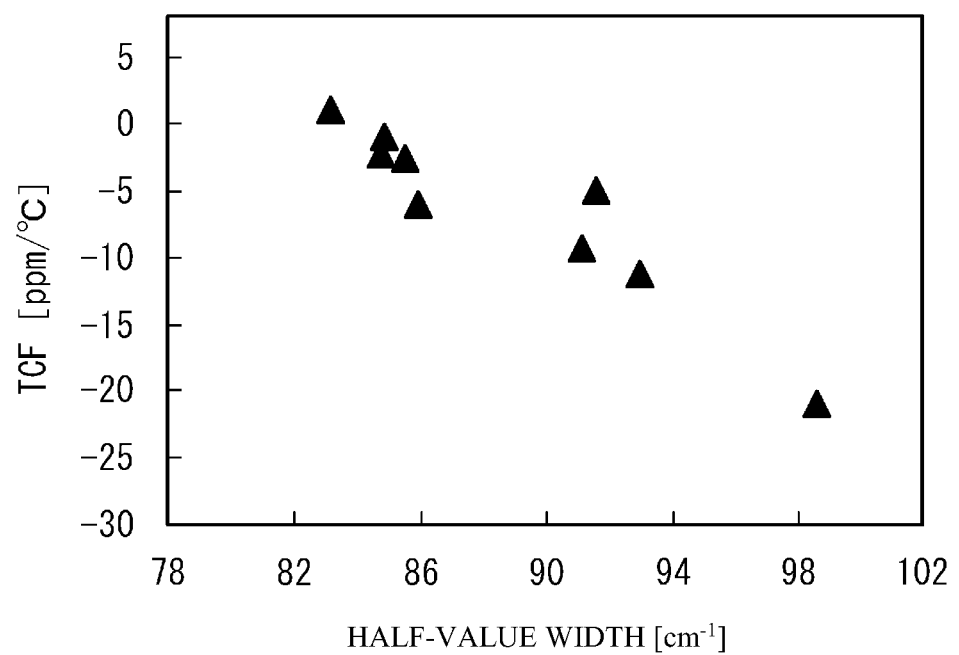
FIG. 14 illustrates TCF of an anti-resonance frequency of a resonator with respect to a half-value width of a transverse optical (TO) mode measured by a FTIR method.

FIG. 14 illustrates the TCF of the anti-resonance frequency of the resonator with respect to the half-value width of the transverse optical (TO) mode measured by the FTIR method. In FIG. 14, the measurement results of each forming condition are indicated by a black triangle. As illustrated in FIG. 14, when the half-value width gets smaller, the TCF of the anti-resonance frequency gets larger and gets closer to zero. Therefore, the TCF is improved.

A description will be given of a reason that the peak wavenumber is related to the TCF. In accordance with Central-force network model (J. Vac. Sci. Technol. Vol. B5, pp 530-537 (1987)), the peak wavenumber of the stretching vibration of the Si—O bond depends on an angle of the Si—O bond as follows.

$$k^2=(f/mo)\times[\sin^2(\theta/2)] \quad \text{[Formula 1]}$$

"k" is the number of peak waves. "f" is atomic force between Si and O. "mo" is atomic weight of oxygen. "θ" is a coupling angle of Si—O—Si.

Based on Lorentz-Lorentz formula, a relationship among dielectric constant, density and molecular polarizability is expressed as follows.

$$(e-1)/(e+2)=4\pi\rho C \quad \text{[Formula 2]}$$

"e" is dielectric constant of a silicon oxide film. "ρ" is density of a silicon oxide film. "C" is molecular polarizability of a silicon oxide film. The dielectric constant, the density and the molecular polarizability of a silicon oxide film have a correlation with the coupling angle θ of the Si—O—Si. Therefore, the peak wavenumber is related to the dielectric constant, the density and the molecular polarizability, based on the Formula 1 and the Formula 2.

The TCF is expressed as follows with use of speed of an acoustic wave at room temperature (25 degrees C.).

$$TCF=1/v\times(\delta v/\delta T)-\alpha \quad \text{[Formula 3]}$$

"v" is propagation speed of an acoustic wave. (δv/δT) is a change rate of the propagation speed "v" with respect to a temperature "T". "α" is a linear thermal expansion coefficient. In accordance with "Temperature-compensated surface-acoustic-wave devices with SiO2 film overlays" J. Appl. Phys. Vol. 50, No. 3, pp 1360-1369 (1979), (δv/δT) is calculated from a temperature coefficient of a substance constant (that is, dielectric constant, density and Young's Modulus) of a substrate (or a silicon oxide substrate). The substance constant such as the dielectric constant, the density or the Young's Modulus of the silicon oxide film has a correlation with the TCF, based on the Formula 3.

As mentioned above, based on the Formulas 1 to 3, it is thought that the peak wavenumber of the stretching vibration of the Si—O bond has a correlation with the TCF.

In FIG. 13 and FIG. 14, the TCF of the anti-resonance frequency of the resonator is described. And, the same results as FIG. 13 and FIG. 14 may be obtained with respect to the TCF of the resonance frequency of the resonator or the TCF of the frequency characteristic of the filter using the resonator.

As described with reference to FIG. 13 and FIG. 14, in an acoustic wave device in which a silicon oxide film covers a comb-like electrode, the TCF of the anti-resonance frequency gets larger and gets closer to zero, when the peak wavenumber gets larger. And, when the half-value width gets smaller, the TCF of the anti-resonance frequency gets larger and gets closer to zero. In view of this point, when the peak wavenumber measured by the FTIR method of the silicon oxide film, in which an element is doped, included in the first medium 20 is larger than that of the undoped silicon oxide film included in the first medium 20, enlargement of the thickness of the first medium 20 is restrained, the TCF of the anti-resonance frequency or the like gets closer to zero, and the frequency-temperature characteristic is improved. And, when the half-value width measured by the FTIR method of the silicon oxide film, in which an element is doped, included in the first medium 20 is smaller than that of the undoped silicon oxide film included in the first medium 20, enlargement of the thickness of the first medium 20 is restrained, the TCF of the anti-resonance frequency or the like gets closer to zero, and the frequency-temperature characteristic is improved.

When the silicon oxide film, in which an element is doped, included in the first medium 20 is a silicon oxide film in which F, Cl, C, N, P or S is doped, the peak wavenumber measured by the FTIR method is larger than that of the undoped silicon oxide film included in the first medium 20. The half-value width measured by the FTIR method is smaller than that of the undoped silicon oxide film included in the first medium 20.

In the above-mentioned embodiments, $SiH_4$, $N_2O$ and $C_2F_6$ are used as the raw material gas to form the SiOF film 18. However, the raw material is not limited. For example, tetraethoxysilan (TEOS), $SiF_4$ or the like other than $SiH_4$ may be used as Si source. For example, $CF_4$, $NF_3$, $F_2$, HF, $SF_6$, $ClF_3$, $BF_3$, $BrF_3$, $SF_4$, $SiF_4$, $NF_4Cl$, $FSiH_2$, $F_3SiH$ or the like other than $C_2F_6$ may be used as F source.

The piezoelectric substrate 10 may be a lithium tantalate (LT) substrate, a ZnO substrate, a KnbO3 substrate, a LBO substrate, quartz substrate or the like other than the LN substrate. It is preferable that an elastic constant of the piezoelectric substrate 10 has a negative temperature coefficient. Elastic constant of above-mentioned substrates has a negative temperature coefficient.

The second medium 22 is not limited to the aluminum oxide film. The second medium 22 has only to be a dielectric material of which sonic speed is higher than sonic speed in the first medium 20. That is, the second medium 22 has only to be a dielectric material of which sonic speed is higher than sonic speed in the undoped silicon oxide film and the silicon oxide film in which an element is doped of the first medium 20. For example, the second medium 22 may be a silicon nitride film other than the aluminum oxide film.

In the first embodiment through the eighth embodiment, an insulating film such as silicon nitride may be provided between the first medium 20 and the piezoelectric substrate 10, the comb-like electrode 12 or the reflection electrode 14.

In the first embodiment through the eighth embodiment, as illustrated in FIG. 1A, the acoustic wave device is a single-port resonance element. However, the structure is not limited. The acoustic wave device may be a multi-mode type acoustic wave filter, a ladder type filter or the like.

The present invention is not limited to the specifically described embodiments, but other embodiments and variations may be made without departing from the scope of the claimed invention.

What is claimed is:

1. An acoustic wave device comprising:
   a comb-like electrode provided on a piezoelectric substrate; and
   a first medium that covers the comb-like electrode and has at least a silicon oxide film in which an element is doped,
   wherein sonic speed in the silicon oxide film in which the element is doped is lower than sonic speed in an undoped silicon oxide film.

2. The acoustic wave device as claimed in claim 1, wherein the first medium includes an undoped silicon oxide film and the silicon oxide film in which the element is doped.

3. The acoustic wave device as claimed in claim 1, wherein:
   the first medium has an undoped silicon oxide film covering the comb-like electrode; and
   the silicon oxide film in which the element is doped is provided on the undoped silicon oxide film.

4. The acoustic wave device as claimed in claim 1, wherein:
   the silicon oxide film in which the element is doped has a first silicon oxide film in which the element is doped and a second silicon oxide film in which the element is doped;
   the first medium has an undoped silicon oxide film;
   the first silicon oxide film covers the comb-like electrode;
   the undoped silicon oxide film is provided on the first silicon oxide film; and
   the second silicon oxide film is provided on the undoped silicon oxide film.

5. The acoustic wave device as claimed in claim 1, wherein the first medium has the silicon oxide film, in which the element is doped, that covers the comb-like electrode and an undoped silicon oxide provided on the silicon oxide film in which the element is doped.

6. The acoustic wave device as claimed in claim 1, wherein the first medium is structured with the silicon oxide film, in which the element is doped, that covers the comb-like electrode.

7. The acoustic wave device as claimed in claim 1, wherein the silicon oxide film in which the element is doped is used as a frequency-regulating film.

8. The acoustic wave device as claimed in claim 1, wherein a sign of a temperature coefficient of an elastic constant of the silicon oxide film in which the element is doped is opposite to a sign of a temperature coefficient of an elastic constant of the piezoelectric substrate.

9. The acoustic wave device as claimed in claim 2, wherein:
   a sign of a temperature coefficient of an elastic constant of the silicon oxide film in which the element is doped is opposite to a sign of a temperature coefficient of an elastic constant of the piezoelectric substrate; and
   a peak wavenumber measured by a FTIR method of the silicon oxide film in which the element is doped is larger than a peak wavenumber measured by the FTIR method of the undoped silicon oxide film included in the first medium.

10. The acoustic wave device as claimed in claim 2, wherein:

a sign of a temperature coefficient of an elastic constant of the silicon oxide film in which the element is doped is opposite to a sign of a temperature coefficient of an elastic constant of the piezoelectric substrate; and a half-value width measured by a FTIR method of the silicon oxide film in which the element is doped is smaller than a half-value width measured by the FTIR method of the undoped silicon oxide film included in the first medium.

11. The acoustic wave device as claimed in claim 1, wherein two or more different elements are doped in the silicon oxide film in which the element is doped.

12. The acoustic wave device as claimed in claim 1, wherein fluorine is doped in the silicon oxide film in which the element is doped.

13. The acoustic wave device as claimed in claim 1 further comprising a second medium provided on the first medium, wherein sonic speed in the second medium is higher than sonic speed in the first medium.

* * * * *